United States Patent
Diana et al.

(10) Patent No.: US 9,660,164 B2
(45) Date of Patent: May 23, 2017

(54) LIGHT EMITTING DEVICE WITH REDUCED EPI STRESS

(71) Applicant: KONINKLIJKE PHILIPS N.V., Eindhoven (NL)

(72) Inventors: Frederic Stephane Diana, Santa Clara, CA (US); Yajun Wei, Loveland, OH (US); Stefano Schiaffino, Pleasanton, CA (US); Brendan Jude Moran, San Jose, CA (US)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 14/798,534

(22) Filed: Jul. 14, 2015

(65) Prior Publication Data

US 2015/0318459 A1    Nov. 5, 2015

Related U.S. Application Data

(63) Continuation of application No. 13/878,837, filed as application No. PCT/IB2011/054430 on Oct. 7, 2011, now Pat. No. 9,093,630.

(Continued)

(51) Int. Cl.
*H01L 33/12* (2010.01)
*H01L 33/64* (2010.01)
(Continued)

(52) U.S. Cl.
CPC ............ *H01L 33/641* (2013.01); *H01L 33/12* (2013.01); *H01L 33/40* (2013.01); *H01L 33/486* (2013.01);
(Continued)

(58) Field of Classification Search
CPC ..... H01L 33/64; H01L 33/641; H01L 33/642; H01L 33/644; H01L 33/647; H01L 33/12;
(Continued)

(56) References Cited

U.S. PATENT DOCUMENTS 8,062,925 B2 * 11/2011 Shchekin ............... H01L 33/44
257/E21.527
9,093,630 B2    7/2015 Diana et al.
(Continued)

FOREIGN PATENT DOCUMENTS

CN    1820376 A    8/2006
CN    101834254 A    9/2010
(Continued)

OTHER PUBLICATIONS

Mavoori, Low-Thermal-Expansion Copper Composites bia Negatice CTE Metallic Elements, Thermal Management, Design, Jun. 1998, JOM, pp. 70-72.*

(Continued)

*Primary Examiner* — Galina Yushina

(57) ABSTRACT

Elements are added to a light emitting device to reduce the stress within the light emitting device caused by thermal cycling. Alternatively, or additionally, materials are selected for forming contacts within a light emitting device based on their coefficient of thermal expansion and their relative cost, copper alloys being less expensive than gold, and providing a lower coefficient of thermal expansion than copper. Elements of the light emitting device may also be structured to distribute the stress during thermal cycling.

12 Claims, 2 Drawing Sheets

Related U.S. Application Data

(60) Provisional application No. 61/392,349, filed on Oct. 12, 2010.

(51) Int. Cl.
  *H01L 33/56* (2010.01)
  *H01L 33/48* (2010.01)
  *H01L 33/40* (2010.01)
  *H01L 33/62* (2010.01)

(52) U.S. Cl.
  CPC .............. *H01L 33/56* (2013.01); *H01L 33/62* (2013.01); *H01L 33/642* (2013.01); *H01L 33/644* (2013.01); *H01L 33/647* (2013.01); *H01L 2924/0002* (2013.01)

(58) Field of Classification Search
  CPC ....... H01L 33/486; H01L 33/40; H01L 33/62; H01L 33/387; H01L 33/507; H01L 33/664; H01L 23/48; H01L 23/532; H01L 23/485; G01L 2924/0002
  See application file for complete search history.

(56) References Cited

U.S. PATENT DOCUMENTS

| | | |
|---|---|---|
| 2006/0202223 A1 | 9/2006 | Sackrison et al. |
| 2007/0096130 A1 | 5/2007 | Schiaffino et al. |
| 2007/0148467 A1* | 6/2007 | St. Lawrence ......... B82Y 10/00 428/411.1 |
| 2007/0267650 A1* | 11/2007 | Hsieh ...................... H01L 33/38 257/99 |
| 2008/0149946 A1* | 6/2008 | Kim ...................... H01L 33/007 257/89 |
| 2008/0230902 A1 | 9/2008 | Lin et al. |
| 2008/0296573 A1* | 12/2008 | Suehiro ................... H01L 33/20 257/53 |
| 2010/0019248 A1* | 1/2010 | Therrien ............. H01L 29/2003 257/76 |
| 2010/0044743 A1* | 2/2010 | Liu ......................... H01L 33/44 257/99 |
| 2010/0252855 A1 | 10/2010 | Kamei |

FOREIGN PATENT DOCUMENTS

| | | |
|---|---|---|
| CN | 101855734 A | 10/2010 |
| JP | 2006-066868 A | 9/2006 |
| JP | 2009-105409 A | 5/2009 |
| JP | 2009-541989 A | 11/2009 |
| JP | 2009-302159 A | 12/2009 |
| JP | 2010-34543 A | 2/2010 |
| WO | WO-0147039 A1 | 6/2001 |
| WO | 2005015647 A1 | 2/2005 |
| WO | 2006131843 A2 | 12/2006 |
| WO | WO-2009/063638 A1 | 5/2009 |

OTHER PUBLICATIONS

Hidnert, Thermal Expansion of Some Copper Alloys, US Department of Commerce, National Bureau of Standares, Research Paper RPI838, vol. 39, Nov. 1947, pp. 419-424.*
LucasMilhaupt, Thermal Expansion Chart, pp. 1-4.*
"Low Thermal Exapansion Copper Composites Via Negative CTE Metallic Elements" Mavoori et al, Thermal Management Design, JOM, Jun. 1998, p. 70-72.
"Thermal Expansion of Some Copper Alloys" Hidnert et al, NIST, Research Paper PR 1838, vol. 39, Nov. 1947, p. 419-424.
Coefficient of Thermal Expansion Chart , Lucas Milhaupt. 2011 p. 1-4.
EPO as ISA, International Search Report and Written Opinion mailed Jan. 16, 2012 from International Application No. PCT/IB2011/054430 filed Oct. 7, 2011, 14 pages.
Office Action issued Nov. 9, 2015 from ROC (Taiwan) Patent Application No. 100136797.
First Office Action issued Jun. 1, 2015 from Chinese Patent Application No. 201180049451.
Office Action mailed Jul. 7, 2015 from Japanese Patent Application No. 2013-533305.
CN OA2MO, Application 201180049451.9, Mar. 11 2016, 16 pps.
JP Office Action, Application 2016-078642, Nov. 8, 2016, 6 pps.
Article 94(3)EPC dated Jul. 29, 2016, European Application No. 11778699.6, 7 pages.

* cited by examiner

LIGHT EMITTING DEVICE WITH REDUCED EPI STRESS

This application is a continuation application of U.S. patent application Ser. No. 13/878,837, filed Apr. 11, 2013, which is a national stage filing under 35 U.S.C. §371(c) of International Appl. No. PCT/IB2011/054430, filed Oct. 7, 2011, which claims priority to U.S. Prov. Appl. No. 61/392,349, filed Oct. 12, 2010, the disclosures of which are incorporated herein by reference in their entirety.

FIELD OF THE INVENTION

This invention relates to the field of light emitting device, and in particular to the manufacture of light emitting devices (LEDs) with reduced epi stress.

BACKGROUND OF THE INVENTION

As the light emitting capabilities of Light Emitting Diodes (LEDs) continues to improve, their use in conventional lighting applications continues to increase, as do the competitive pressures to provide reliable, long-lasting products in a cost-effective manner. Even though the cost of LED products is relatively low, the savings of even a few cents per device can have a significant impact on profit margin, due to the increasingly growing market for these devices.

To reduce the cost of LED devices, copper can replace gold as the bulk metal for electrical contacts for LED dies. However gold still remains the preferred metal to provide efficient and reliable electrical and mechanical interconnections between the LED and its submount in a flip-chip configuration, wherein the upper layer of a LED die is attached to a submount, and light from the LED is emitted from a surface opposite the submount.

FIG. 1A illustrates a conventional flip-chip submount configuration of a light emitting device 100. The submount may include a base 110 upon which contacts 120 are formed; the contacts may be plated 125 to facilitate connections 145 to the flip chip contacts 150. The flip chip may comprise a growth substrate 170, a light emitting element 160, interconnect layers 165, and contacts 150. The growth substrate 170, commonly sapphire or other rigid material, may be removed after the flip chip is attached to the submount.

Two contacts 120 are illustrated in FIG. 1A, separated by a channel 130 that provides electrical isolation between the two contacts 120. In like manner, the contacts 150 are illustrated as being separated by a channel 135. The channel 135 may be smaller than the channel 130, in order to increase an amount of support provided to the interconnect layers 165 and light emitting element 170 by the contacts 150. This increased support may be particularly beneficial during the removal of the growth substrate 170. Also, the channel 130 may be larger than the channel 135 is order to accommodate potential alignment inaccuracy when the flip-chip is placed on the submount.

FIG. 1B illustrates an example thermal deformation 190 that may be caused when the light emitting device 100 is subject to high temperatures after the growth substrate 170 is removed. This deformation 190 may occur during manufacturing, and each time the light emitting device 100 is cycled from off to on. The deformation 190 may induce repeated stress to the interconnect layers 165 and the light emitting element 160, and may cause the device 100 to fail prematurely. Additionally, the upper layer 175 of the light emitting device may be etched to increase the light extraction efficiency of the light emitting element 170, which may cause the upper layer 175 to be more susceptible to stress induced failures.

SUMMARY OF THE INVENTION

It would be advantageous to mitigate the amount of stress in a light emitting device that is caused by thermal cycling. It would be advantageous to mitigate this stress without significantly increasing the cost of the light emitting device.

In an embodiment of this invention, elements are added to the light emitting device to reduce the stress caused by thermal cycling. Alternatively, or additionally, the materials are selected for forming contacts within a light emitting device based on their coefficient of thermal expansion and their relative cost, copper alloys providing a lower coefficient of thermal expansion than copper. Elements of the light emitting device may also be structured to distribute the stress during thermal cycling.

The light emitting device may include a submount, a light emitting structure having a metal layer with contacts separated by a channel, and one or more elements that are added to reduce a thermally induced stress in the light emitting structure in a vicinity of the channel. The added elements may include, for example, a buffer layer between the metal layer and a light emitting element in the light emitting structure, one or more gaps in the metal layer, a filler material within the channel, a filler material between contacts on the submount, and additional micro bumps in an area adjacent the channel.

The light emitting device may also, or alternatively, use an alloy with a relatively low CTE for the metal layer. A copper alloy may be used, including, for example, CuNi, CuNiTi, CuW, CuFe, and CuMo. The CTE of the alloy is preferably lower than the CTE of copper (about 16 ppm/K), more preferably less than 10 ppm/K, and more preferably less than 8 ppm/K.

BRIEF DESCRIPTION OF THE DRAWINGS

The invention is explained in further detail, and by way of example, with reference to the accompanying drawings wherein.

Throughout the drawings, the same reference numerals indicate similar or corresponding features or functions. The drawings are included for illustrative purposes and are not intended to limit the scope of the invention.

DETAILED DESCRIPTION

In the following description, for purposes of explanation rather than limitation, specific details are set forth such as the particular architecture, interfaces, techniques, etc., in order to provide a thorough understanding of the concepts of the invention. However, it will be apparent to those skilled in the art that the present invention may be practiced in other embodiments, which depart from these specific details. In like manner, the text of this description is directed to the example embodiments as illustrated in the Figures, and is not intended to limit the claimed invention beyond the limits expressly included in the claims. For purposes of simplicity and clarity, detailed descriptions of well-known devices, circuits, and methods are omitted so as not to obscure the description of the present invention with unnecessary detail.

For ease of reference, because the stress may be shown to be most significant at the uppermost/surface layer 175 (hereinafter the epi-layer) of the light emitting element 160, this disclosure will address the stress at the epi-layer 175, although one of skill in the art will recognize that a stress induced failure may occur anywhere within the light emitting element 160 or the interconnects 165. Accordingly, terms such as 'cracking the epi-layer' are to be interpreted as 'cracking the epi-layer or any layer below the epi-layer'. In like manner, the layer comprising the contacts 150 may include other elements than the contacts; for ease of reference, the term 'metal layer 150' is used hereinafter to identify the layer of metal that provides support to the light emitting element 160.

Figure 1A:
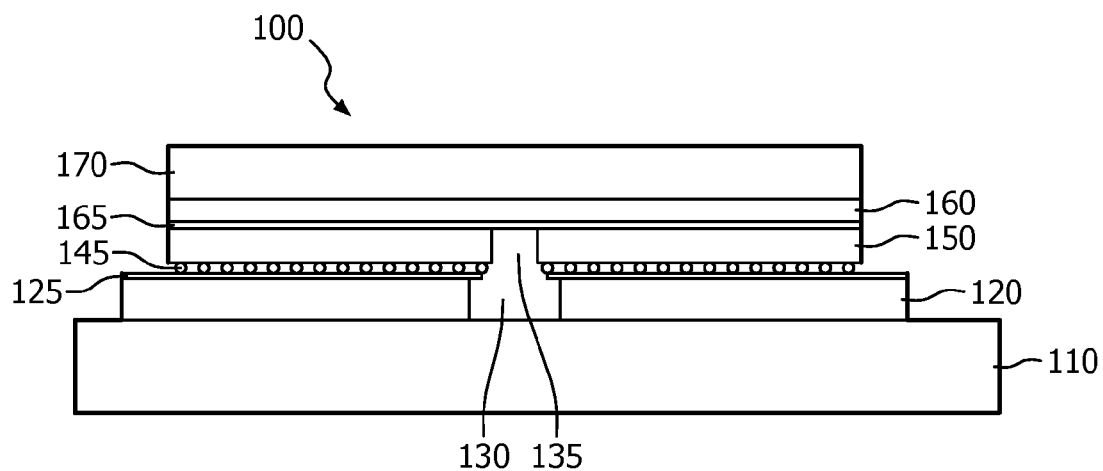
FIGS. 1A-1B illustrates an example flip-chip on submount light emitting device in the prior art.
Figure 1B:
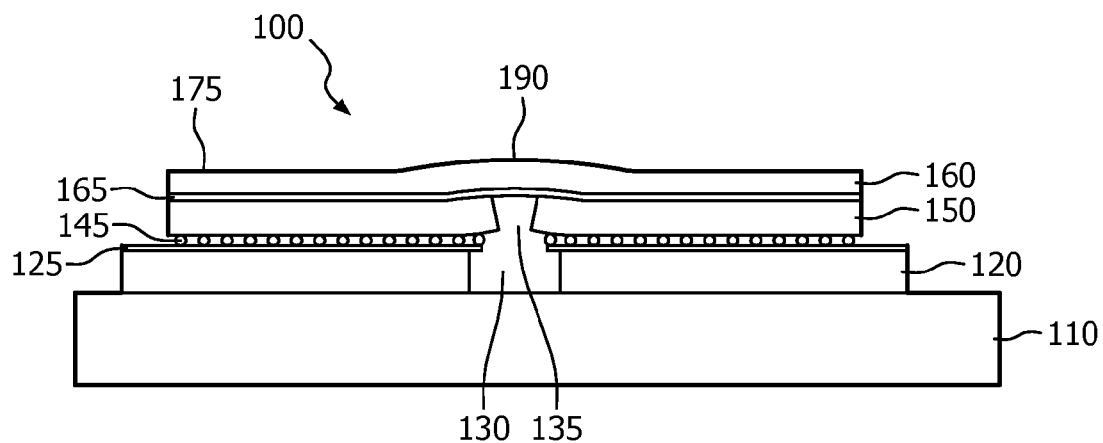

Gold has been shown to be a suitable material for forming the metal layer 150 of the light emitting device of FIGS. 1A and 1B. To reduce costs, copper has been proposed for use instead of gold for this metal layer 150. However, a copper-to-copper interconnect may not provide the desired reliability for the light emitting device 100; accordingly, gold may be used as the connection material 145, which may be in the form of a micro bump layer. In this manner, if the plating 125 of the metal layer 120 is also gold, a gold-to-gold interconnect may be formed, providing a more reliable electrical and/or thermal interconnection between the flip-chip and the submount.

Copper has a Young's modulus of 110 GPa, which is stronger than that of gold which is 77 GPa (or 26 GPa for annealed gold wires). In addition, copper has much less plastic effect than gold. Accordingly, the use of copper for the metal layer 150 reduces the probability of cracking the epi-layer 175 if/when the growth substrate 170 is removed. However, during thermal cycling, a copper metal layer will introduce significantly more deformation 190 than a gold metal layer, which may increase the likelihood of cracking the epi-layer 175 during thermal cycling.

Further, if gold micro bumps 145 are used between the copper metal layer 150 and the submount, the amount of deformation 190 caused by copper metal layer 150 is likely to be more significant, because gold is a relatively compliant material, allowing the edges of the copper metal layer 150 at the channel 135 to lift even further.

In an embodiment, the material selected for the metal layer 150 is selected based on its coefficient of thermal expansion (CTE). In particular, an alloy having a lower coefficient of thermal expansion than copper may be used to form the metal layer 150. For example, this alloy may include CuNi, CuNiTi, CuW, CuFe, CuMo, etc. The NiTi alloy may be quite effective because it has a negative CTE.

Copper has a CTE of 16-18.5 ppm/K within a temperature range of 20-250 C. This CTE is much higher than a majority of the other materials used to form the light emitting device, and much higher than that of Alumina, which may be used as the submount, with a CTE of less than 10 ppm/K. Alloying copper with a low or even negative CTE material would provide an alloy with a CTE less than copper.

Finite Element Analysis (FEA) has demonstrated that a maximum stress caused by thermal cycling may be reduced from 1481 MPa down to 384.5 MPa when the CTE of the metal layer is reduced from 18 ppm/K to 8 ppm/K. To achieve a CTE of 8 ppm/K, a plating process may be used to form a copper alloy of Ni, TiNi, W, Fe, Mo, and so on. Particularly, $Ti_{0.507}Ni_{0.493}$ alloy has a negative CTE of −21 ppm/K, and may be the most effective.

Figure 2:
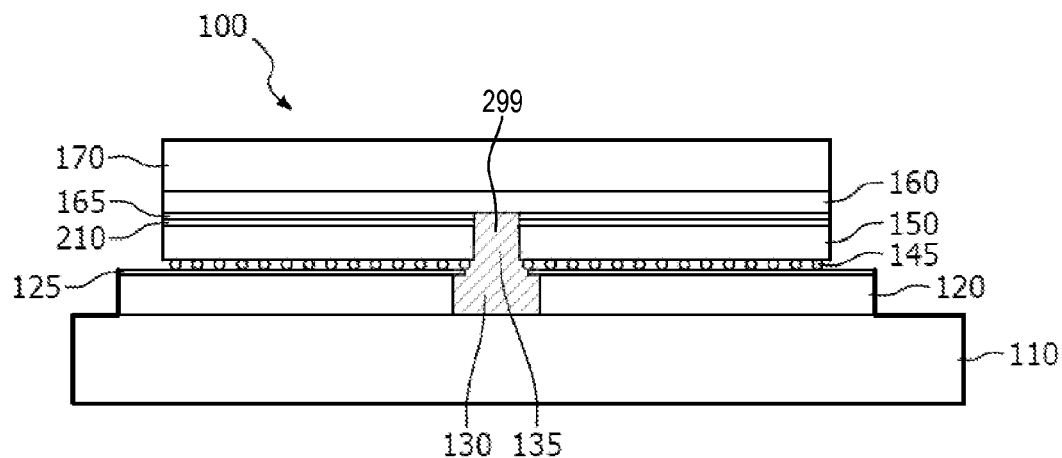
FIG. 2 illustrates an example light emitting device with a buffer layer above the metal layer.

As illustrated in FIG. 2, alternatively, or additionally, a compliant metallization layer 210, such as gold or aluminum, may be introduced between the metal layer 150 and the interconnects 165, to act as a buffer between the metal layer 150 and the interconnects 165, to absorb some of the stress caused by thermal cycling.

A layer 210 of softer material, such as gold or aluminum may be applied, corresponding to the pattern used to create the metal layer 150. This layer 250 acts as a buffer to alleviate the CTE mismatch between the metal layer 150 and the upper layers 160 and 165. It has been estimated that a 1 µm thick layer of gold may reduce the maximum principle stress within the epi-layer 175 by as much as 42%, and a 3 µm thick layer of gold can reduce the maximum principle stress within the epi-layer 175 by 49%. In lieu of a continuous layer of this compliant material, a layer of micro bumps may also be used to further enhance the compliancy of this buffer layer.

Figure 3:
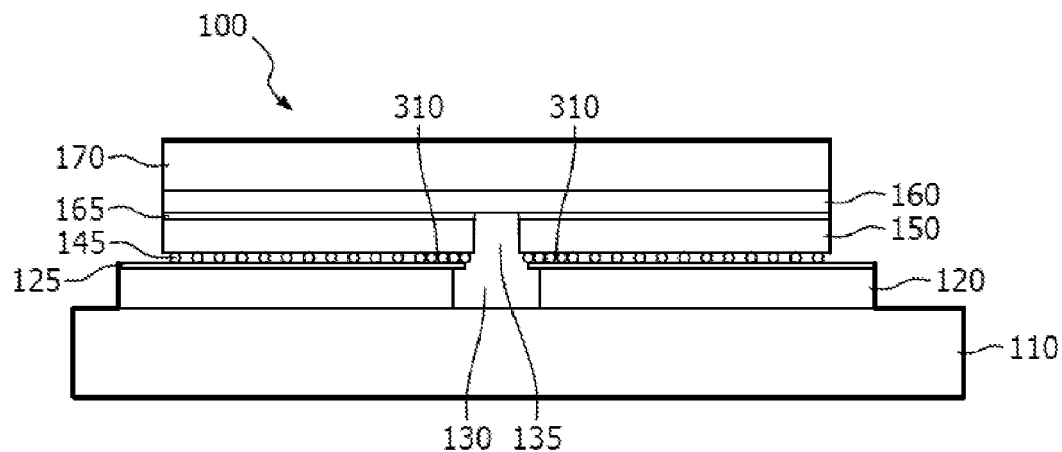
FIG. 3 illustrates an example light emitting device with an increased density of connection material adjacent the channel.

Also alternatively or additionally, the compliancy of the micro bump layer 145 can be reduced. Just as introducing a buffer to absorb a portion of the deformation caused by thermal cycling, reducing the compliancy of the micro bump layer will serve to restrict this distortion. The compliancy may be reduced, for example, by reducing the height of the micro bump layer 145, or by increasing the density or size of the micro bumps, particularly in the vicinity of the channel 135, as illustrated at 310 of FIG. 3.

Alternatively or additionally, the channel areas 130 or 135 may be filled with a material 299 that has a closer CTE to the material of the metal layer 150, thereby providing a more thermally consistent layer, reducing the distortion 190.

The LED 100 may be overmolded with a silicone resin that molded or shaped to form a lens. Because the lens overmold material will likely flow into the channels 130 and 135, and may have a CTE around 200 ppm/K, its thermal expansion will further increase the distortion of the metal layer 150 and the corresponding stress within the epi-layer 175. By filling the channel 130 on the submount side with a material with a lower CTE, the thermal expansion within the channel and the effects from this expansion will be reduced. Also, by filling the channel 135 with a material having a CTE closer to the CTE of the metal layer 150, the expansion or warping of the metal layer 150 will be reduced.

Figure 4:
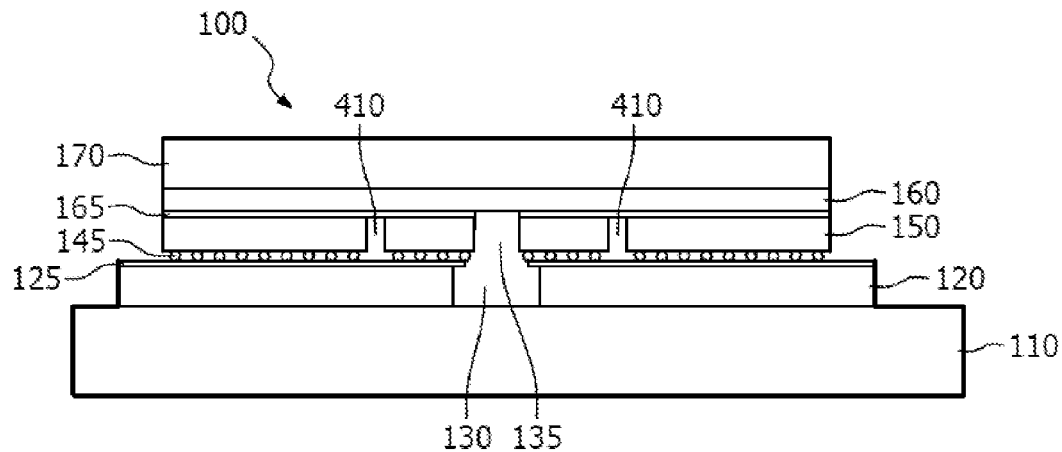
FIG. 4 illustrates an example light emitting device with gaps added to the metal layer.

As illustrated in FIG. 4, alternatively, or additionally, the metal layer 150 may be structured or patterned to reduce the stress caused by thermal cycling.

For example, the mask used to create the metal layer 150 may include small gaps or trenches 410, i.e. un-metallized areas, that serve to redistribute the effects of the CTE mismatch between the metal layer 150 and the upper layers 160 and 165. These gaps 410 split the lateral stresses and strains that are incurred in the upper layers 160 and 165 due to the thermal expansion of the layer 150, thereby mitigating the stress at the region above the channel 135 as well.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

We claim:

1. A light emitting device comprising:
   a submount having first contacts separated by at least one first channel,
   a light emitting structure having a metal layer including second contacts separated by at least one second channel, and
   one or more elements added to the light emitting structure to reduce a thermally induced stress in the light emitting structure in a vicinity of the second channel, wherein the one or more elements include a single gap in each second contact, each single gap being closer to the second channel than to the outer edge of the corresponding second contact, the single gaps cutting through the second contacts, the single gaps being situated to distribute the stress beyond the vicinity of the second channel.

2. The light emitting device of claim 1, wherein the one or more elements include a buffer layer between the metal layer and a light emitting element in the light emitting structure, the buffer layer having a higher compliancy than the metal layer.

3. The light emitting device of claim 2, wherein the buffer layer includes gold.

4. The light emitting device of claim 1, wherein the one or more elements include a filler material within the second channel, the filler material being selected based on its coefficient of thermal expansion.

5. The light emitting device of claim 1, wherein the metal layer includes an alloy having a coefficient of thermal expansion that is less than a coefficient of thermal expansion of copper within a temperature range of (20-250)° C.

6. The light emitting device of claim 5, wherein the alloy includes a copper alloy.

7. The light emitting device of claim 6, wherein the copper alloy includes at least one of: CuNi, CuNiTi, CuW, CuFe, and CuMo.

8. The light emitting device of claim 6, wherein the copper alloy includes CuNiTi.

9. The light emitting device of claim 5, wherein the coefficient of thermal expansion of the alloy is less than 10 ppm/K within a temperature range of (20-250)° C.

10. The light emitting device of claim 5, wherein the coefficient of thermal expansion of the alloy is less than 8 ppm/K within a temperature range of (20-250)° C.

11. The light emitting device of claim 5, wherein the second contacts are each coupled to a corresponding first contact by a connection material that has a density that varies form a higher density to an area adjacent the second channel to a lower density in an area distant form the second channel.

12. A light emitting device comprising:
    a submount having first contacts separated by at least one first channel,
    a light emitting structure having a metal layer including second contacts separated by at least one second channel, and
    one or more elements added to the light emitting structure to reduce a thermally induced stress in the light emitting structure in a vicinity of the second channel, wherein the one or more elements include one or more gaps in the second contacts proximate to the second channel, the gaps cutting through the second contacts, the gaps being situated to distribute the stress beyond the vicinity of the second channel, wherein the one or more elements include a filler material within the first channel, the filler material being selected based on its coefficient of thermal expansion.

* * * * *